United States Patent [19]

McAdams

[11] Patent Number: 5,274,828
[45] Date of Patent: Dec. 28, 1993

[54] COMPUTER INCLUDING AN INTEGRATED CIRCUIT HAVING AN ON-CHIP HIGH VOLTAGE SOURCE

[75] Inventor: Hugh P. McAdams, McKinney, Tex.

[73] Assignee: Texas Instruments Incorporated, Dallas, Tex.

[21] Appl. No.: 840,419

[22] Filed: Feb. 24, 1992

[51] Int. Cl.$^5$ .............................................. G06F 1/26
[52] U.S. Cl. ..................... 395/750; 364/DIG. 1; 364/232.8; 364/273.2; 364/273.5
[58] Field of Search ..................... 395/750; 364/707

[56] References Cited

U.S. PATENT DOCUMENTS

| | | | |
|---|---|---|---|
| 4,090,236 | 5/1978 | Bennett et al. | 395/750 |
| 4,317,181 | 2/1982 | Teza et al. | 364/707 |
| 4,361,873 | 11/1982 | Harper et al. | 395/750 |
| 4,503,494 | 3/1985 | Hamilton et al. | 395/750 |
| 4,901,283 | 2/1990 | Hanoury et al. | 395/750 |
| 5,041,964 | 8/1991 | Cole et al. | 395/725 |

OTHER PUBLICATIONS

Digital System Design and Microprocessors; McGraw-Hill Book Company; Author: John P. Hayes. The 80286 Microprocessor Hardware, Software, and Interfacing; Prentice Hall; Authors: Walter A. Triebel and Avtar Singh.

*Primary Examiner*—Debra A. Chun
*Attorney, Agent, or Firm*—Richard B. Havill; Leo N. Heiting; Richard L. Donaldson

[57] ABSTRACT

A computer system includes a data processor, an address bus, a data bus, and a read only memory device interconnected with the data processor by way of the address and data buses. A random access memory device also is interconnected with the data processor by way of the address and data buses. The random access memory device includes an on-chip voltage supply, a node for connecting with a second voltage supply, and a selection circuit, arranged to be selectively enabled for supplying charge to a load circuit from either the second voltage supply or the on-chip voltage supply. Voltage $V_{pp}$, applied to the load circuit from the on-chip voltage supply, has been boosted to a magnitude that is higher than the voltage $V_{dd}$ of the second voltage supply. Charge supplied by the combination of the second voltage supply and the on-chip voltage supply is less than the charge used by a single on-chip boosted voltage supply.

12 Claims, 3 Drawing Sheets

COMPUTER INCLUDING AN INTEGRATED CIRCUIT HAVING AN ON-CHIP HIGH VOLTAGE SOURCE

FIELD OF THE INVENTION

This invention relates to a computer system and more particularly to a computer system having large-scale integrated circuits arranged to operate at low power consumption.

BACKGROUND OF THE INVENTION

A computer system is an arrangement which receives information, or data, from one or more data sources, processes the data through a routine to produce a result, and transmits the result to an output device, such as a display, a printer, or another machine that is in communication with the computer system. Computer systems are designed for both general purpose uses and for special purpose uses. They range in size from large ones to small ones, each depending upon its intended use. Small computer systems now include personal computers, such as laptop computers, notebook computers, handheld computers, and plastic card computers.

All of the aforementioned small computers include integrated circuit (IC) devices which are interconnected in some arrangement which processes the data under control of commands provided by a program. Energy, for operating each integrated circuit device, is supplied from an off-chip power supply. Some of the small computers are operated by energy supplied from a battery.

The rate of energy, or power, consumption for the small, battery operated, computer is an important system design criteria. Generally the computer system user desires the small computer system to operate from the battery for a duration that is as long as possible. Several computer system design techniques help to extend the duration of useful discharge of the battery energy, i.e., to extend the useful battery life between recharge cycles or replacement.

Since each typical small computer system includes several integrated circuit devices, it is very important to design each integrated circuit chip to consume as little energy, or power, as possible.

Integrated circuit devices, such as dynamic random access memory (DRAM) devices, are used in large numbers in each small computer system. Some dynamic random access memory devices include an on-chip high voltage source which generates a voltage $V_{pp}$ that is higher than the voltage $V_{dd}$ applied to the memory device from an off-chip voltage source, such as a battery.

The on-chip high voltage $V_{pp}$ is used for two purposes within the memory device. One purpose is for driving a selected wordline to the high voltage $V_{pp}$ so that, in spite of a threshold voltage drop lost because of the operation of an n-channel, enhancement-mode pass gate transistor, the selected storage cell still reaches the maximum restore voltage $V_{dd}$. A second purpose is for applying the high voltage $V_{pp}$ to the gate electrode of the n-channel, enhancement-mode transfer gate transistor, which is interposed between a bitline and a sense node of a sense amplifier. In spite of the threshold voltage drop lost because of the transfer gate transistor, the sense node and the bitline both reach the voltage $V_{dd}$ when desired during operation.

An on-chip high voltage convertor is used to produce the voltage $V_{pp}$ which is higher than the off-chip supply voltage $V_{dd}$. Such a high voltage convertor is fabricated right in the substrate and therefore uses some chip area. As the density of storage cells is increased in a memory chip, more and more chip surface is required for the high voltage supply circuits. A lower power and smaller chip area alternative is sought for efficiently boosting the voltage of the wordlines and the gate electrodes of the transfer gate transistors to a magnitude that is higher than the off-chip supply voltage $V_{dd}$.

SUMMARY OF THE INVENTION

These and other problems are solved by a computer system having a data processor; an address bus; a data bus; a read only memory device interconnected with the data processor by way of the address and data buses; and a random access memory device interconnected with the data processor by way of the address and data buses, the random access memory device including an on-chip high voltage supply, a node for connecting with another voltage supply, and a selection circuit, arranged to selectively conduct charge to a load circuit alternatively from the other voltage supply and the on-chip high voltage supply.

An on-chip high voltage $V_{pp}$ has a magnitude that is higher than the voltage $V_{dd}$ of the other voltage supply. Charge, or energy, supplied by a combination of the other voltage supply and the on-chip high voltage supply is less than the charge used by the MOS transistor invertor used heretofore to boost on-chip voltage above the voltage $V_{dd}$.

When the voltage supplied to the load circuit is boosted, the new arrangement produces a voltage magnitude $V_{pp}$ that is at least a threshold voltage drop higher than the magnitude of the voltage $V_{dd}$ of the other voltage supply.

The selection circuit includes p-channel and n-channel, enhancement-mode MOS transistors, which are fabricated on the semiconductor substrate.

Because of the charge being supplied from the other voltage supply, the integrated circuit chip area required for on-chip high voltage conversion and the total energy, or power, supplied by the other voltage supply are conserved substantially in the computer system.

BRIEF DESCRIPTION OF THE DRAWINGS

A better understanding of the invention may be derived by reading the detailed description following with reference to the appended drawings wherein.

DETAILED DESCRIPTION

Figure 1:
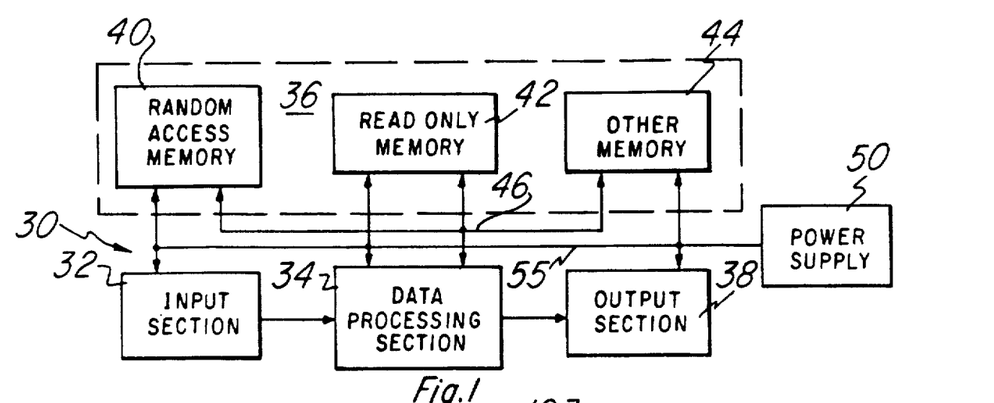
FIG. 1 is a block diagram of a computer system including a data processor, a memory, and an output arrangement.

Referring to FIG. 1, there is shown a block diagram of a microcomputer system 30. There are an input section 32, a data processing section 34, a memory section 36, and an output or display section 38. The data processing section 34 is a microprocessor, i.e., a data processor that is fabricated as an integrated circuit which executes instructions of a program to process data.

The microprocessor communicates with the outside world by way of the input and output sections 32 and 38. The input section 32 may include a keyboard, a communication modem, or any other arrangement which can transmit digital data or commands to the microprocessor. The output 38 section may include a video display, a plotter, a printer, or any other arrangement which can receive digital data from the microprocessor and convert that data into a visual image or a control signal.

The input section 32 transmits digital information to the microprocessor as data for processing or as a command for controlling the processing of data. As data is received by the microprocessor, the data may be either forwarded directly to a writable portion of the memory section 36 for storage or processed and the result sent to a writable portion of the memory section 36 for storage.

The memory section 36 stores information in a digital format. The information may be either data for processing or the program commands for processing the data. This memory section typically includes two parts. One part, referred to as random access memory 40, is used for storing either data or program information. The random access memory 40 stores data which is expected to be changed from time to time. Random access memory 40 can include either short term or long term memory or both of them. The second part of the memory section is read only memory 42, which also may store either data or program information. Information stored in the read only memory 42 is stored permanently and is not expected to be changed. Also shown in the memory section 36 is other memory 44 representing any additional memory device for storing information in the microcomputer system 30. The microprocessor accesses information from the memory section 36 by applying an address to an address bus, included within a bus structure 46, for selecting the memory location storing desired information. Control signals, applied over the bus structure 46, enable the accessed memory location to transmit the desired information through a data bus, also included within the bus structure 46, to the microprocessor for processing. Any resultant of the processing may be stored back into the random access memory or transmitted to the output section 38 for display or other utilization.

Additional descriptive material relating to the design of microcomputer systems can be found in many publications, e.g., "Digital System Design and Microprocessors", J. P. Hayes, McGraw-Hill Book Company, 1984, Chapters 1 and 5 and "The 80286 Microprocessor" by W. A. Tribel et al, Prentice Hall, 1990, Chapters 1 and 9, which are incorporated herein by reference thereto.

Any of the sections of the microcomputer system 30 may include integrated circuit devices which are powered from a voltage supply 50. A lead 55 from the voltage supply to each of the integrated circuit devices provides the power for operating those devices.

Microcomputer systems, designed to be carried about by the user, generally operate from a battery power supply. Such a battery has a finite amount of energy which can be delivered to the microcomputer system before the battery must be either replaced or recharged. The duration that such energy can be supplied is considered to be the useful battery lifetime. Extending the useful lifetime of the battery is very important to the microcomputer system user. The useful lifetime can be extended by making improvements to the battery or by reducing the energy required to operate one or more parts of the microcomputer system. An example of such an arrangement is described in U.S. Pat. No. 4,317,181, which is assigned to the assignee of the instant application and is incorporated herein by reference thereto.

Figure 2:
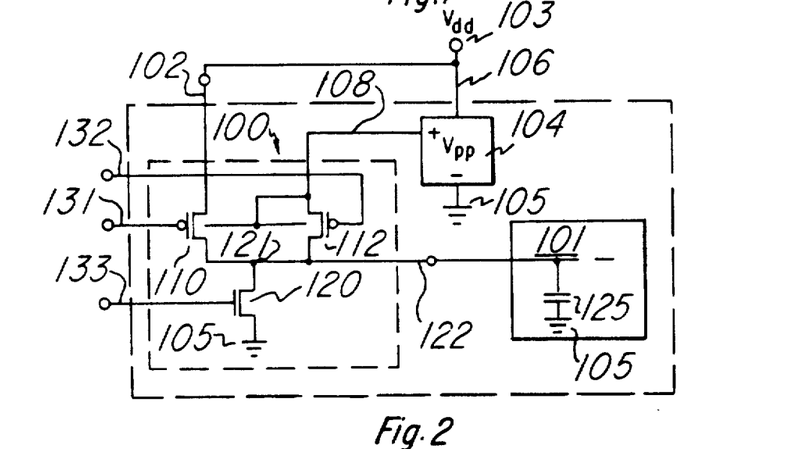
FIG. 2 is an illustrative schematic diagram of an on-chip voltage supply selection circuit for a computer system.

Referring now to FIG. 2, there is shown a schematic diagram of a selection circuit 100 that is a portion of an integrated circuit chip, such as the random access memory 40 of FIG. 1. Selection circuit 100 is arranged for supplying charge to an on-chip load circuit 101 from either a voltage supply 103 that connects with an input power lead, or node 102 or an on-chip voltage supply 104, which has its positive polarity terminal, or node connected to the selection circuit 100 and has its negative polarity terminal connected to ground reference 105. The on-chip voltage supply 104 is powered from the other voltage supply 103 by way of a lead 106. Included within the on-chip voltage supply 104 are a boot-strap circuit, a rectifier and a filter. The other voltage supply 103 may be located either off-chip or on-chip. A pair of common drain coupled, p-channel, enhancement-mode metal-oxide-semiconductor (MOS) transistors 110 and 112 are included in the selection circuit 100. An n-channel, enhancement-mode MOS transistor 120 has its drain electrode connected to the common drain node 121 of the MOS transistors 110 and 112. The source electrode of the MOS transistor 120 is connected to the ground reference 105.

An output lead 122 from the selection circuit 100 is connected between the common drain node 121 and the load circuit 101 for supplying energy, or power, to the load circuit 101. A capacitor 125, connected between the output lead 122 and the ground reference 105 is an illustrative load of the selection circuit 100. The illustrative capacitive load is shown because the actual load in an integrated circuit dynamic random access memory device, such as memory 40 of FIG. 1, is characterized as a basically capacitive load. A more complete description of an illustrative arrangement for supplying boosted voltage to the gate electrode of a transfer gate transistor, interposed between a bitline and the sense node of a sense amplifier, is presented in a patent application Ser. No. 840,418, filed by applicant concurrently herewith and assigned to Texas Instruments.

There are three input control leads 131, 132 and 133 used for applying control signals to the selection circuit 100 for enabling the delivery of charge, or energy, from the voltage supply 103 and the on-chip voltage supply 104 at alternative times through the selection circuit 100 to the capacitor 125.

Figure 3:
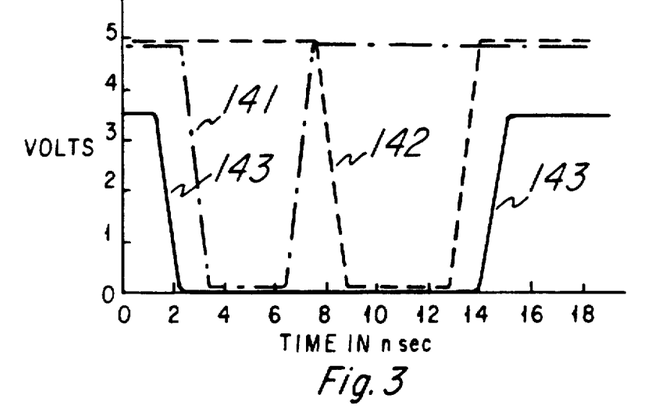
FIG. 3 is a timing diagram showing input control signals applied to the on-chip voltage supply selection circuit of FIG. 2.

Referring now to FIG. 3, there is shown a timing diagram for three input control signals 141, 142 and 143, which are applied, respectively, to the input control leads 131, 132 and 133 of FIG. 2. When the input control signal 143 is applied to the input control lead 133, it makes a negative-going transition to a low level that is applied to the gate electrode of the n-channel, enhancement-mode MOS transistor 120, disabling the MOS transistor 120 from conducting. Shortly thereafter the input control signal 141, applied to the input control lead 131, also swings to the low level enabling the p-channel, enhancement-mode MOS transistor 110 to conduct.

As a result, charge, or energy, from the voltage supply 103, connected to the voltage supply lead, or node, 102, is conducted through the enabled MOS transistor 110 to the capacitor 125 for charging that capacitor to the magnitude of the voltage $V_{dd}$ of the voltage supply 103.

Figure 4:
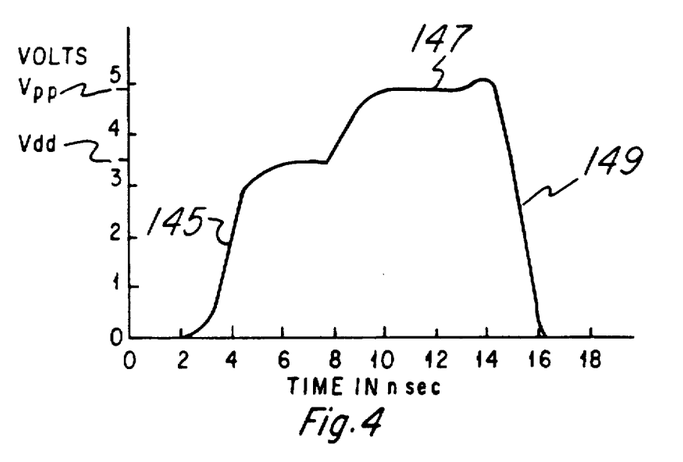
FIG. 4 is an output characteristic curve for the on-chip voltage supply selection circuit of FIG. 2 when it is responding to the input control signals of FIG. 3.

Referring to FIG. 4, there is shown, between the times 2 and 7, a curve segment 145 representing the voltage supplied on the lead 122 in FIG. 2 to the capacitor 125 while the MOS transistor 110 is enabled and the MOS transistor 120 is disabled. The maximum magnitude of the curve segment 145 is the voltage $V_{dd}$ of the voltage supply 103.

Then the input control signal 141, applied to the gate electrode of the MOS transistor 110, rises to disable the MOS transistor 110 from conducting by the time 7. At time 7, the input control signal 142, applied over the input control lead 132 to the gate of the p-channel, enhancement-mode MOS transistor 112, goes low enabling the MOS transistor 112 to conduct charge from the on-chip voltage supply 104 to the load capacitor 125.

Referring again to FIG. 4, there is shown another curve segment 147 between the times 7 and 12 showing the voltage applied over the output lead 122 to the capacitor 125 while the MOS transistor 112 is conducting. When the input control signal 142 subsequently rises and disables conduction through the MOS transistor 112, the charge applied to the load capacitor 125 peaks at a boosted voltage $V_{pp}$ which exceeds the supply voltage $V_{dd}$ by at least a threshold voltage $V_t$ of an MOS transistor.

As shown in FIGS. 3 and 4 between the times 13 and 16, the input control signal 143 rises to turn on the n-channel, enhancement-mode MOS transistor 120 which discharges the capacitor 125 to the ground reference level, as shown by the curve segment 149.

Figure 5:
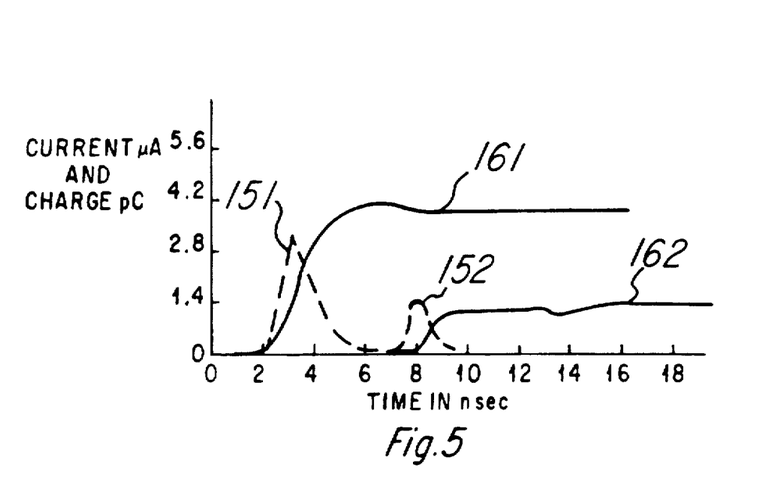
FIG. 5 is a charge flow, or energy used, diagram for the other voltage supply, for the on-chip voltage supply, and for the load of the selection circuit of FIG. 2.

Referring to FIG. 5, there are shown curves representing the supply currents associated with the input voltage pulses of FIG. 3 and the charge drawn both from the voltage supply 103 through the lead, or node, 102 and the MOS transistor 110 and from the on-chip high voltage supply 104 through a lead, or node, 108 and the MOS transistor 112 when producing the boosted voltage $V_{pp}$, shown in FIG. 4. Two pulses of supply current are presented in FIG. 5. At time 3, a first pulse of supply current 151, drawn from the voltage supply in response to signal 141, peaks at 2.80 microamperes and causes the voltage supply 103 to deliver 3.50 microcoulombs of charge through the lead, or node, 102 to the selection circuit 100. Curve 161 represents the total charge delivered through the lead, or node 102 over time. At time 8, a second pulse of supply current 152, drawn from the on-chip supply 104 in response to signal 142, peaks at 1.40 microamperes. This supply current pulse 152 causes the on-chip power supply 104 to deliver 1.30 microcoulombs of charge through a lead, or node 108 to the selection circuit 100. Curve 162 represents the total charge delivered from the on-chip voltage supply 104 to the circuit 100 over time.

To determine a total current, or charge, requirement for the selection circuit 100, the designer must determine the charge used in both leads 102 and 106. When determining the charge delivered from the voltage supply 103 through the lead 106, the efficiency of the on-chip supply 104 must be taken into account in supplying the 1.30 microcoulombs of charge to the selection circuit 100. Maximum efficiency is 50%, but it may be less if the circuit design is inefficient. If this efficiency is 50%, then the charge required from the supply 103 is twice the 1.30 microcoulombs delivered to the load. Then add the result to the 3.50 microcoulombs of charge delivered directly from the voltage supply 103 through the lead 102 to the selection circuit 100. Thus a total charge delivered from the voltage supply 103 is 6.10 microcoulombs.

Figure 6:
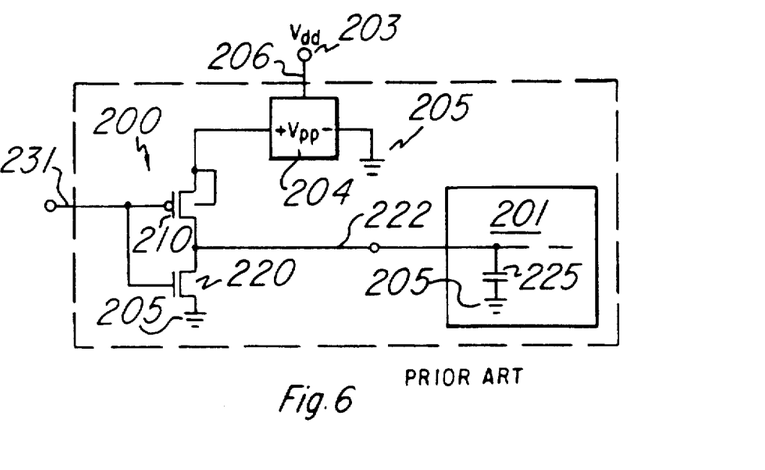
FIG. 6 is a schematic diagram of a prior art on-chip voltage supply circuit for a computer system.

Referring now to FIG. 6, there is shown a schematic diagram of a prior art complementary metal oxide semiconductor (CMOS) invertor circuit 200 which is used for applying the high voltage $V_{pp}$ of an on-chip voltage supply 204 to a load circuit 201. The on-chip high voltage supply 204 includes a high voltage convertor circuit. Also the on-chip voltage supply 204 has a negative polarity terminal connected with ground reference 205 and a positive polarity terminal connected to the source electrode of a p-channel, enhancement-mode MOS transistor 210. The source electrode is also connected with the substrate. A drain electrode of the MOS transistor 210 is connected through an output lead 222 to the load circuit 201 and to a drain electrode of an n-channel, enhancement-mode MOS transistor 220. A source electrode of the MOS transistor 220 is connected to the ground reference 205. An illustrative capacitor 225 is connected between the output lead 222 and ground reference 205 because the typical integrated circuit memory device loads are considered to be capacitive loads.

An input control signal is applied to the invertor circuit 200 by way of an input control lead 231 which connects to the gate electrodes of both MOS transistors 210 and 220. Operation of the invertor circuit 200 is illustrated by the diagrams of FIGS. 7, 8 and 9.

Figure 7:
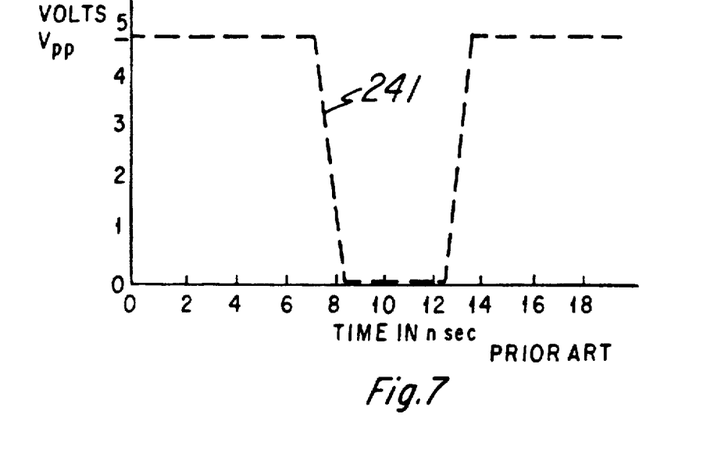
FIG. 7 is a timing diagram showing an input control signal that is applied to the on-chip voltage supply circuit of FIG. 6.

Referring to FIG. 7, there is shown an input control signal 241 which is applied to the input control lead 231 of FIG. 6. At time 7, the input control signal 241 makes a negative-going transition to a low level which enables the MOS transistor 210 and disables the MOS transistor 220.

Figure 8:
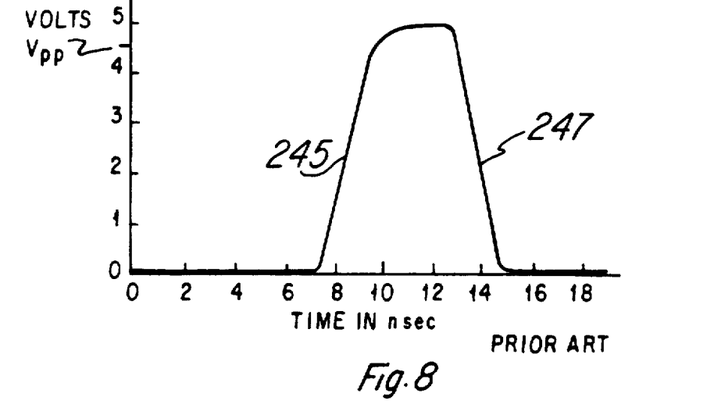
FIG. 8 is an output characteristic curve for the on-chip voltage supply circuit of FIG. 6 when it is responding to the input control signal of FIG. 7.
Figure 9:
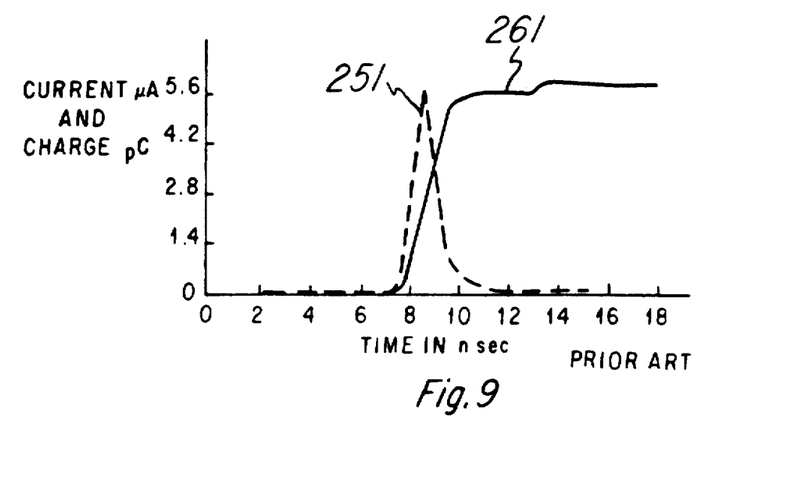
FIG. 9 is a charge flow, or energy used, diagram for the on-chip power supply and for the load of the prior art voltage supply circuit of FIG. 6.

Referring to FIG. 8, there is shown between times 7 and 12 an output voltage characteristic curve segment 245 which is produced as a result of the negative-going transition in the input control signal 241 of FIG. 7. The output voltage curve peaks at a high voltage $V_{pp}$, which is higher than the magnitude of the voltage $V_{dd}$ of the voltage supply 203 of FIG. 6.

When the input control signal 241 of FIG. 7 rises again between times 12 and 13, another curve segment 247 occurs in the FIG. 8 as the voltage applied to the load circuit 201 makes a negative-going transition from the high voltage $V_{pp}$ to the ground reference potential.

In FIG. 9, there are two curves which represent input current and total charge delivered from the on-chip high voltage supply 204 to the invertor circuit 200. At time 8, a pulse of input current 251 peaks at 4.90 microamperes and causes the on-chip voltage supply 204 to deliver 5.25 microcoulombs of charge to the invertor circuit 200. Curve 261 represents the total charge delivered through the lead 222 over time. Since this is an on-chip high voltage supply, the efficiency of the on-chip high voltage convertor requires the charge delivered by the on-chip voltage supply to be doubled in determining the charge requirement from the off-chip voltage supply 203. The off-chip voltage supply 203 therefor is required to deliver 10.50 microcoulombs of charge to the on-chip high voltage supply 204 in order for it to deliver 5.25 microcoulombs of charge to the invertor circuit 200. The other 5.25 microcoulombs of charge are consumed within the on-chip high power supply 204.

In comparing the performance of the selection circuit 100 of FIG. 2 with the performance of the invertor circuit 200 of FIG. 6, it is noted that the selection circuit 100 requires 6.10 microcoulombs of charge while the invertor circuit 200 requires 10.50 microcoulombs of current in producing the boosted voltage $V_{pp}$. Total power required by the circuits 100 and 200 to produce the boosted voltage is directly proportional to the charge delivered by those circuits.

Thus the selection circuit 100 arrangement of FIG. 2 reduces the charge demand upon the off-chip voltage supply 103 below the charge demand of the invertor circuit 200 upon the voltage supply 203 of FIG. 6. An approximation of the percent of power saved can be determined as follows:

$$100 \times \frac{\text{(Off-chip charge to circuit 200} - \text{Off-chip charge to circuit 100)}}{\text{Off-chip charge to circuit 200}} = 100 \times$$

$$\frac{(10.5 - 6.1)}{10.5} = 41.9\%.$$

A significant saving in off-chip power requirement is achieved by the selection circuit 100 arrangement of FIG. 2. This power saving can be used for supplying charge to additional on-chip circuits not previously utilized in a small data processing system or for extending the useful lifetime of an off-chip battery in a portable data processor.

The foregoing describes an embodiment of the invention. Such embodiment together with other embodiments, made obvious in view thereof, are considered to be within the scope of the appended claims.

What is claimed is:

1. A semiconductor integrated circuit comprising:
a first node for connecting with an on-chip voltage supply;
a second node for connecting with an off-chip voltage supply;
a common load circuit; and
a selection circuit, connected with the first node, the second node, and the common load and responsive to control signals, for supplying charge to the common load circuit alternatively from either the first node or the second node.

2. A semiconductor integrated circuit, in accordance with claim 1, wherein
the on-chip voltage supply produces a first magnitude voltage that is at least a threshold voltage drop higher than a second magnitude voltage of the off-chip voltage supply.

3. A semiconductor integrated circuit, in accordance with claim 1, wherein
the selection circuit includes an n-channel, enhancement-mode transistor having a gate electrode for receiving a signal for enabling or disabling a connection to ground for the common load circuit.

4. A semiconductor integrated circuit, in accordance with claim 1, wherein
a first p-channel, enhancement-mode transistor is connected for conducting charge from the first node to the common load circuit, in response to a first control signal, applied to a gate electrode of the first p-channel, enhancement-mode transistor.

5. A semiconductor integrated circuit, in accordance with claim 4, wherein
a second p-channel, enhancement-mode transistor is connected for conducting charge from the second node to the common load circuit, in response to a second control signal, applied to a gate electrode of the second p-channel, enhancement-mode transistor.

6. A semiconductor integrated circuit, in accordance with claim 5, wherein
the first and second control signals are applied alternatively so that the first and second p-channel, enhancement-mode transistors alternatively supply charge to the common load circuit and produce a voltage magnitude that is at least a threshold voltage drop greater than the magnitude of the voltage of the off-chip voltage supply.

7. A semiconductor integrated circuit comprising:
a first node for connecting with an on-chip voltage supply;
a second node for connecting with another voltage supply;
a common load circuit; and
a selection circuit, interconnected with the first and second nodes and the common load circuit and responsive to be selectively enabled for supplying charge to the common load circuit from either the first node or the second node.

8. A computer system comprising:
a data processor;
an address bus;
a data bus;
a read only memory device interconnected with the data processor by way of the address and data buses; and
a random access memory device interconnected with the data processor by way of the address and data buses, the random access memory device including an on-chip voltage supply, a node for connecting with a second voltage supply, and a selection circuit, interconnected with the on-chip voltage supply and the node and responsive for supplying charge alternatively to a load circuit from either the on-chip voltage supply or the second voltage supply.

9. A computer system, in accordance with claim 8, further comprising:
a battery interconnected with the data processor, the read only memory, and the random access memory device for providing the second voltage to the node.

10. A computer system, in accordance with claim 9, wherein
the selection circuit is responsive to control signals for alternatively coupling charge from either the second voltage supply or the on-chip voltage supply to charge the load circuit to a voltage magnitude that is at least a threshold voltage drop higher than the magnitude of the voltage of the battery.

11. A computer system, in accordance with claim 9, wherein the selection circuit is responsive to control signals for coupling charge from the second voltage supply for charging the load circuit to the voltage of the battery and for coupling charge from the on-chip voltage supply for boosting the load circuit to a voltage magnitude that is at least a threshold voltage drop higher than the voltage of the battery.

12. A computer system, in accordance with claim 8, further comprising:

an input section interconnected with the data processor; and an output section interconnected with the data processor.

* * * * *

(12) REEXAMINATION CERTIFICATE (4704th)
United States Patent
McAdams (10) Number: US 5,274,828 C1
(45) Certificate Issued: Jan. 7, 2003

(54) COMPUTER INCLUDING AN INTEGRATED CIRCUIT HAVING AN ON-CHIP HIGH VOLTAGE SOURCE

(75) Inventor: Hugh P. McAdams, McKinney, TX (US)

(73) Assignee: Texas Instruments Incorporated, Dallas, TX (US)

Reexamination Request:
No. 90/006,024, May 29, 2001

Reexamination Certificate for:
Patent No.: 5,274,828
Issued: Dec. 28, 1993
Appl. No.: 08/840,419
Filed: Feb. 24, 1992 07/840,419

(51) Int. Cl.[7] .............. G06F 1/26; G06F 1/28; G06F 1/30
(52) U.S. Cl. ............ 713/300; 713/310; 713/320; 713/321; 713/322; 713/323; 713/324; 713/330; 713/340; 365/185.13; 327/408; 327/427; 361/86
(58) Field of Search .............. 713/300–340; 365/185; 327/408, 427; 361/86

(56) References Cited

U.S. PATENT DOCUMENTS

| | | | | |
|---|---|---|---|---|
| 3,624,493 A | * | 11/1971 | Gately | 323/277 |
| 3,643,232 A | * | 2/1972 | Kilby | 257/205 |
| 3,733,496 A | * | 5/1973 | Schade | 327/115 |
| 3,835,530 A | * | 9/1974 | Kilby | 29/832 |
| 4,051,388 A | * | 9/1977 | Inukai | 326/106 |
| 4,423,492 A | * | 12/1983 | Yoshida | 327/535 |
| 4,437,172 A | | 3/1984 | Masuoka | |
| 4,528,465 A | * | 7/1985 | Harvey | 326/127 |
| 5,023,836 A | * | 6/1991 | Mori | 327/192 |
| 5,055,705 A | | 10/1991 | Hall | |
| 5,077,691 A | | 12/1991 | Haddad et al. | |
| 6,002,299 A | * | 12/1999 | Thomsen | 330/107 |

OTHER PUBLICATIONS

"A 5V–Only 256k Bit CMOS Flash EEPROM", Sebastiano D'Arrigo, et al., 1989 IEEE International Solid–State Circuits Conference Digest of Technical Papers, Session 10: Nonvolatile Memories, 36th ISSCC, First Edition, ISSN 0193–6539, Feb. 1989, pp. 132–133.

"A 4Mb 5V–Only Flash EEPROM With Sector Erase", Harvey Stiegler, et al., IEEE Solid–State Circuits Council, 1990 Symposium on VLSI Circuits, Digest of Technical Papers, IEEE Cat. No. 90 CH 2885–2, Jun. 7–9, 1990, pp. 103–104.

* cited by examiner

*Primary Examiner*—Rupal Dharia (57) ABSTRACT

A computer system includes a data processor, an address bus, a data bus, and a read only memory device interconnected with the data processor by way of the address and data buses. A random access memory device also is interconnected with the data processor by way of the address and data buses. The random access memory device includes an on-chip voltage supply, a node for connecting with a second voltage supply, and a selection circuit, arranged to be selectively enabled for supplying charge to a load circuit from either the second voltage supply or the on-chip voltage supply. Voltage $V_{pp}$, applied to the load circuit from the on-chip voltage supply, has been boosted to a magnitude that is higher than the voltage $V_{dd}$ of the second voltage supply. Charge supplied by the combination of the second voltage supply and the on-chip voltage supply is less than the charge used by a single on-chip boosted voltage supply.

ND US 5,274,828 C1

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 7 and 8 are determined to be patentable as amended.

Claims 2–6 and 9–12, dependent on an amended claim, are determined to be patentable.

New claims 13–59 are added and determined to be patentable.

1. A semiconductor integrated circuit comprising:
 a first node for connecting with an on-chip voltage supply;
 a second node for connecting with an off-chip voltage supply;
 a common load circuit; and
 a selection circuit, connected with the first node, the second node, and the common load *circuit* and responsive to control signals, for supplying charge *alternatively* to the common load circuit [alternatively] from [either] the first node [or] *and* the second node, *thereby producing a voltage at the common load circuit in response to a sum of the charge from the first and second nodes*.

7. A semiconductor integrated circuit comprising:
 a first node for connecting with an on-chip voltage supply;
 a second node for connecting with another voltage supply;
 a common load circuit; and
 a selection circuit, interconnected with the first and second nodes and the common load circuit and responsive to be selectively enabled for suppling charge to the common load circuit from [either] the first node [or] *and* the second node, *thereby producing a voltage at the common load circuit in response to the charge from the first and second nodes*.

8. A computer system comprising:
 a data processor;
 an address bus;
 a data bus;
 a read only memory device interconnected with the data processor by way of the address and data buses; and
 a random access memory device interconnected with the data processor by way of the address and data buses, the random access memory device including an on-chip voltage supply, a node for connecting with a second voltage supply, and a selection circuit, interconnected with the on-chip voltage supply and the node and responsive for supplying charge alternatively to a load circuit from [either] the on-chip voltage supply [or] *and* the second voltage supply, *thereby producing a voltage at the load circuit in response to a sum of the charge from the on-chip voltage supply and the second voltage supply*.

*13. A semiconductor integrated circuit, in accordance with claim 7, wherein the on-chip voltage supply produces a first magnitude voltage that is at least a threshold voltage drop greater than a second magnitude voltage of the another voltage supply.*

*14. A semiconductor integrated circuit, in accordance with claim 7, wherein the selection circuit includes an n-channel, enhancement-mode transistor having a gate electrode for receiving a signal for enabling or disabling a connection to ground for the common load circuit.*

*15. A semiconductor integrated circuit, in accordance with claim 14, wherein a first p-channel, enhancement mode transistor is connected for conducting charge from the first node to the common load circuit, in response to a first control signal, applied to a gate electrode of the first p-channel, enhancement mode transistor.*

*16. A semiconductor integrated circuit, in accordance with claim 15, wherein a second p-channel, enhancement mode transistor is connected for conducting charge from the second node to the common load circuit, in response to a second control signal, applied to a gate electrode of the second p-channel, enhancement mode transistor.*

*17. A semiconductor integrated circuit, in accordance with claim 16, wherein the first and second control signals are applied alternatively so that the first and second p-channel, enhancement mode transistors alternatively supply charge to the common load circuit and produce a voltage magnitude that is at least a threshold voltage drop greater than a magnitude of a voltage of the another voltage supply.*

*18. A semiconductor integrated circuit, in accordance with claim 7, comprising a plurality of transistors having respective control gates, wherein the common load comprises the control gates.*

*19. A semiconductor integrated circuit, in accordance with claim 18, wherein each of the plurality of transistors is a pass gate transistor of a respective memory cell and wherein the common load is a word line.*

*20. A semiconductor integrated circuit, in accordance with claim 19, wherein each memory cell is a dynamic random access memory cell.*

*21. A semiconductor integrated circuit, in accordance with claim 18, comprising a plurality of sense amplifiers and a plurality of respective bitlines, wherein each of the plurality of transistors is a transfer gate transistor interposed between a respective sense amplifier and a respective bitline.*

*22. A semiconductor integrated circuit, in accordance with claim 21, wherein the bitlines are coupled to respective dynamic random access memory cells.*

*23. A semiconductor integrated circuit, in accordance with claim 7, the selection circuit comprising:*
 *a first transistor having a current path connected between the first node and the common load;*
 *a second transistor having a current path connected between the second node and the common load; and*
 *a third transistor having a current path connected between a reference terminal and the common load.*

*24. A semiconductor integrated circuit, in accordance with claim 23, wherein at least one of the first and the second transistor is a p-channel transistor and wherein the third transistor is an n-channel transistor.*

*25. A semiconductor integrated circuit, in accordance with claim 23, wherein no more than one of the current paths of the first, second, and third transisors is conductive during a steady-state condition.*

*26. A semiconductor integrated circuit comprising:*
 *a plurality of bitlines;*
 *a plurality of sense amplifiers;* a plurality of transistors having a common gate terminal, each transistor having a current path connected between a respective bitline and a respective sense amplifier;

a first node for connecting with an on-chip voltage supply;

a second node for connecting with another voltage supply;

a common load circuit including the common gate terminal; and a selection circuit, interconnected with the first and second nodes and the common load circuit and responsive to be selectively enabled for supplying charge to the common load circuit from the first node and the second node, thereby producing a voltage at the common load circuit in response to a sum of the charge from the first and second nodes.

27. A semiconductor integrated circuit, in accordance with claim 26, wherein the on-chip voltage supply produces a first magnitude voltage that is at least a threshold voltage drop greater than a second magnitude voltage of the another voltage supply.

28. A semiconductor integrated circuit, in accordance with claim 26, the selection circuit comprising:

a first transistor having a current path connected between the first node and the common load;

a second transistor having a current path connected between the second node and the common load; and a third transistor having a current path connected between a reference terminal and the common load.

29. A semiconductor integrated circuit, in accordance with claim 28, wherein at least one of the first and the second transistor is a p-channel transistor and wherein the third transistor is an n-channel transistor.

30. A semiconductor integrated circuit, in accordance with claim 28, wherein no more than one of the current paths of the first, second, and third transistors is conductive during a steady-state condition.

31. A semiconductor integrated circuit, in accordance with claim 26, that is a dynamic random access memory circuit.

32. A semiconductor integrated circuit comprising:

a first node for connecting with an on-chip voltage supply;

a second node for connecting with another voltage supply;

a common load circuit; and a selection circuit, interconnected with the first and second nodes and the common load circuit and responsive to be selectively enabled for supplying charge to the common load circuit from the first node and the second node, wherein the charge from the first node produces one part of a voltage at the common load circuit and the charge from the second node produces another part of the voltage at the common load circuit.

33. A semiconductor integrated circuit, in accordance with claim 32, wherein the on-chip voltage supply produces a first magnitude voltage that is at least a threshold voltage drop greater than a second magnitude voltage of the another voltage supply.

34. A semiconductor integrated circuit, in accordance with claim 32, wherein the selection circuit includes an n-channel, enhancement-mode transistor having a gate electrode for receiving a signal for enabling or disabling a connection to ground for the common load circuit.

35. A semiconductor integrated circuit, in accordance with claim 34, wherein a first p-channel, enhancement mode transistor is connected for conducting charge from the first node to the common load circuit, in response to a first control signal, applied to a gate electrode of the first p-channel, enhancement mode transistor.

36. A semiconductor integrated circuit, in accordance with claim 35, wherein a second p-channel, enhancement mode transistor is connected for conducting charge from the second node to the common load circuit, in respone to a second control signal, applied to a gate electrode of the second p-channel, enhancement mode transistor.

37. A semiconductor integrated circuit, in accordance with claim 36, wherein the first and second control signals are applied alternatively so that the first and second p-channel, enhancement mode transistors alternatively supply charge to the common load circuit and produce a voltage magnitude that is at least a threshold voltage drop greater than a magnitude of a voltage of the another voltage supply.

38. A semiconductor integrated circuit, in accordance with claim 32, comprising a plurality of transistors having respective control gates, wherein the common load comprises the control gates.

39. A semiconductor intergated circuit, in accordance with claim 38, wherein each of the plurality of transistors is a pass gate transistor of a respective memory cell and wherein the common load is a word line.

40. A semiconductor integrated circuit, in accordance with claim 39, wherein each memory cell is a dynamic random access memory cell.

41. A semiconductor integrated circuit, in accordance with claim 38, comprising a plurality of sense amplifiers and a plurality of respective bitlines, wherein each of the plurality of transistors is a transfer gate transistor interposed between a respective sense amplifier and a respective bitline.

42. A semiconductor integrated circuit, in accordance with claim 41, wherein the bitlines are coupled to respective dynamic random access memory cells.

43. A semiconductor integrated circuit, in accordance with claim 32, the selection circuit comprising:

a first transistor having a current path connected between the first node and the common load;

a second transistor having a current path connected between the second node and the common load; and a third transistor having a current path connected between a reference terminal and the common load.

44. A semiconductor integrated circuit, in accordance with claim 43, wherein at least one of the first and the second transistor is a p-channel transistor and wherein the third transistor is an n-channel transistor.

45. A semiconductor integrated circuit, in accordance with claim 43, wherein no more than one of the current paths of the first, second, and third transistors is conductive during a steady-state condition.

46. A semiconductor integrated memory circuit comprising:

a first node for connecting with an on-chip voltage supply;

a second node for connecting with another voltage supply;

a common load circuit; and a selection circuit, interconnected with the first and second nodes and the common load circuit and responsive to be selectively enabled for supplying charge to the common load circuit from the first node and the second node during a read operation of the memory circuit.

47. A semiconductor integrated circuit, in accordance with claim 46, wherein the on-chip voltage supply produces a first magnitude voltage that is at least a threshold voltage drop greater than a second magnitude voltage of the another voltage supply.

48. A semiconductor integrated circuit, in accordance with claim 46, wherein the selection circuit includes an n-channel, enhancement-mode transistor having a gate electrode for receiving a signal for enabling or disabling a connection to ground for the common load circuit.

49. A semiconductor integrated circuit, in accordance with claim 48, wherein a first p-channel, enhancement mode transistor is connected for conducting charge from the first node to the common load circuit, in response to a first control signal, applied to a gate electrode of the first p-channel, enhancement mode transistor.

50. A semiconductor integrated circuit, in accordance with claim 49, wherein a second p-channel, enhancement mode transistor is connected for conducting charge from the second node to the common load circuit, in response to a second control signal, applied to a gate electrode of the second p-channel, enhancement mode transistor.

51. A semiconductor integrated circuit, in accordance with claim 50, wherein the first and second control signals are applied alternatively so that the first and second p-channel, enhancement mode transistors alternatively supply charge to the common load circuit and produce a voltage magnitude that is at least a threshold voltage drop greater than a magnitude of a voltage of the another voltage supply.

52. A semiconductor integrated circuit, in accordance with claim 46, comprising a plurality of transistors having respective control gates, wherein the common load comprises the control gates.

53. A semiconductor integrated circuit, in accordance with claim 52, wherein each of the plurality of transistors is a pass gate transistor of a respective memory cell and wherein the common load is a word line.

54. A semiconductor integrated circuit, in accordance with claim 53, wherein each memory cell is a dynamic random access memory cell.

55. A semiconductor integrated circuit, in accordance with 52, comprising a plurality of sense amplifiers and a plurality of respective bitlines, wherein each of the plurality of transistors is a transfer gate transistor interposed between a respective sense amplifier and a respective bitline.

56. A semiconductor integrated circuit, in accordane with claim 55, wherein the bitlines are coupled to respective dynamic random access memory cells.

57. A semiconductor integrated circuit, in accordance with claim 46, the selection circuit comprising:
 a first transistor having a current path connected between the first node and the common load;
 a second transistor having a current path connected between the second node and the common load; and
 a third transistor having a current path connected between a reference terminal and the common load.

58. A semiconductor integrated circuit, in accordance with claim 57, wherein at least one of the first and the second transistor is a p-channel transistor and wherein the third transistor is an n-channel transistor.

59. A semiconductor integrated circuit, in accordance with claim 57, wherein no more than one of the current paths of the first, second, and third transistors is conductive during a steady-state condition.

\* \* \* \* \*